United States Patent
Hsu et al.

(10) Patent No.: US 9,685,520 B1
(45) Date of Patent: Jun. 20, 2017

(54) MANUFACTURING METHOD OF SEMICONDUCTOR DEVICE

(71) Applicant: UNITED MICROELECTRONICS CORP., Hsin-Chu (TW)

(72) Inventors: Shuo-Lin Hsu, Tainan (TW); Hsin-Ta Hsieh, Tainan (TW); Chun-Chia Chen, Tainan (TW); Chen-Chien Li, Tainan (TW); Hung-Chang Chang, Taichung (TW); Ta-Kang Lo, Taoyuan (TW); Tsai-Fu Chen, Hsinchu (TW); Shang-Jr Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/355,032

(22) Filed: Nov. 17, 2016

(51) Int. Cl.
| | |
|---|---|
| H01L 21/00 | (2006.01) |
| H01L 29/423 | (2006.01) |
| H01L 29/66 | (2006.01) |
| H01L 29/49 | (2006.01) |

(52) U.S. Cl.
CPC ...... *H01L 29/4236* (2013.01); *H01L 29/4966* (2013.01); *H01L 29/66545* (2013.01); *H01L 29/66666* (2013.01)

(58) Field of Classification Search
CPC ....... H01L 21/82345; H01L 21/823462; H01L 21/823842; H01L 21/823857; H01L 29/4236; H01L 29/4966
See application file for complete search history.

(56) References Cited

U.S. PATENT DOCUMENTS

| | | | |
|---|---|---|---|
| 7,074,680 B2 | 7/2006 | Doczy | |
| 9,524,968 B1* | 12/2016 | Lai | H01L 27/0922 |
| 2016/0071944 A1* | 3/2016 | Lu | H01L 29/42376 257/392 |
| 2016/0126139 A1 | 5/2016 | Yang | |
| 2016/0276224 A1* | 9/2016 | Gan | H01L 21/823842 |
| 2016/0358290 A1* | 12/2016 | Chiu | G06F 19/328 |
| 2017/0053996 A1* | 2/2017 | Kim | H01L 29/66545 |
| 2017/0062282 A1* | 3/2017 | Lin | H01L 27/0922 |

OTHER PUBLICATIONS

Liu, Title of Invention: Semiconductor Device and Method of Forming the Same, U.S. Appl. No. 15/046,458, filed Feb. 18, 2016.

* cited by examiner

*Primary Examiner* — Richard Booth
(74) *Attorney, Agent, or Firm* — Winston Hsu

(57) ABSTRACT

A manufacturing method of a semiconductor device includes the following steps. A first gate dielectric layer is formed in a first gate trench and a second gate dielectric layer is formed in a second gate trench. A first bottom barrier layer is formed on the first gate dielectric layer and the second gate dielectric layer. A first conductivity type work function layer is formed on the first bottom barrier layer. A first treatment to the first gate dielectric layer and/or a second treatment to the first bottom barrier layer on the first gate dielectric layer are performed before the step of forming the first conductivity type work function layer. The first treatment and the second treatment are used to modify threshold voltages of specific transistors, and thicknesses of work function layers formed subsequently may be modified for increasing the related process window accordingly.

20 Claims, 14 Drawing Sheets

MANUFACTURING METHOD OF SEMICONDUCTOR DEVICE

BACKGROUND OF THE INVENTION

1. Field of the Invention

The present invention relates to a manufacturing method of a semiconductor device, and more particularly, to a manufacturing method of a semiconductor device including transistors having different threshold voltages.

2. Description of the Prior Art

The development of semiconductor integrated circuit technology progresses continuously and circuit designs in products of the new generation become smaller and more complicated than those of the former generation. The amount and the density of the functional devices in each chip region are increased constantly according to the requirements of innovated products, and the size of each device has to become smaller accordingly.

Poly-silicon is conventionally used as a gate electrode in semiconductor devices, such as the metal-oxide-semiconductor (MOS). With the trend towards scaling down the size of semiconductor devices, however, conventional poly-silicon gates face problems such as inferior performance due to boron penetration and unavoidable depletion effects. This increases equivalent thickness of the gate dielectric layer, reduces gate capacitance and worsens a driving force of the devices. Therefore, work function metals that are suitable for use as the high-k gate dielectric layer are used to replace the conventional poly-silicon gate to be the control electrode. However, transistors having different conductivity types and/or different threshold voltages are required in integrated circuits, and gate stacks of these transistors may be different from one another for presenting different conductivity types and/or different threshold voltages. Accordingly, for the related industries, it is important to integrate manufacturing processes of these gate stacks efficiently.

SUMMARY OF THE INVENTION

A manufacturing method of a semiconductor device is provided by the present invention. In the manufacturing method, a treatment to a gate dielectric layer and/or a treatment to a bottom barrier layer may be performed locally for modifying threshold voltages of specific transistors, and thicknesses of work function layers may be modified for increasing the related process window.

According to an embodiment of the present invention, a manufacturing method of a semiconductor device is provided. The manufacturing method includes the following steps. A semiconductor substrate is provided. A dielectric layer is formed on the semiconductor substrate. The dielectric layer includes a first gate trench and a second gate trench. A first gate dielectric layer is formed in the first gate trench and a second gate dielectric layer is formed in the second gate trench. A first bottom barrier layer is formed on the first gate dielectric layer and the second gate dielectric layer. A first conductivity type work function layer is formed on the first bottom barrier layer. The first conductivity type work function layer in the first gate trench is removed. A second conductivity type work function layer is formed on the first bottom barrier layer in the first gate trench and on the first conductivity type work function layer in the second gate trench. A first treatment to the first gate dielectric layer and/or a second treatment to the first bottom barrier layer on the first gate dielectric layer are performed before the step of forming the first conductivity type work function layer. A component of the first gate dielectric layer is different from a component of the second gate dielectric layer after the first treatment, and/or a component of the first bottom barrier layer on the first gate dielectric layer is different from a component of the first bottom barrier layer on the second gate dielectric layer after the second treatment.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 2-11 are schematic drawings illustrating the manufacturing method of the semiconductor device according to the first embodiment of the present invention, wherein FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a schematic drawing in a step subsequent to FIG. 8, FIG. 10 is a schematic drawing in a step subsequent to FIG. 9, and FIG. 11 is a schematic drawing in a step subsequent to FIG. 10.

FIG. 13 and FIG. 14 are schematic drawings illustrating a manufacturing method of a semiconductor device according to a third embodiment of the present invention, wherein FIG. 14 is a schematic drawing in a step subsequent to FIG. 13.

DETAILED DESCRIPTION

Figure 1:
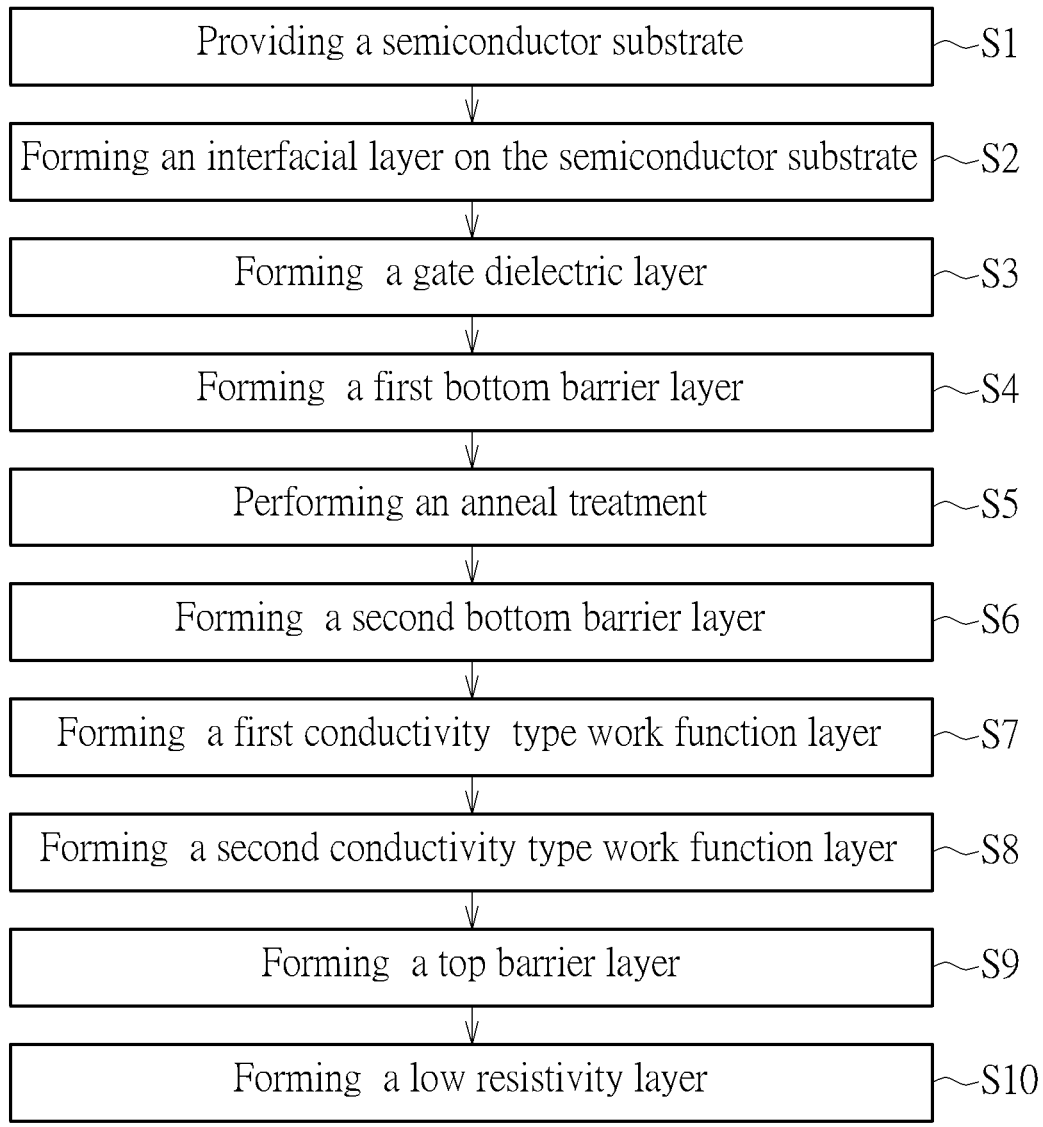
FIG. 1 is a flow chart of a manufacturing method of a semiconductor device according to a first embodiment of the present invention.
Figure 2:
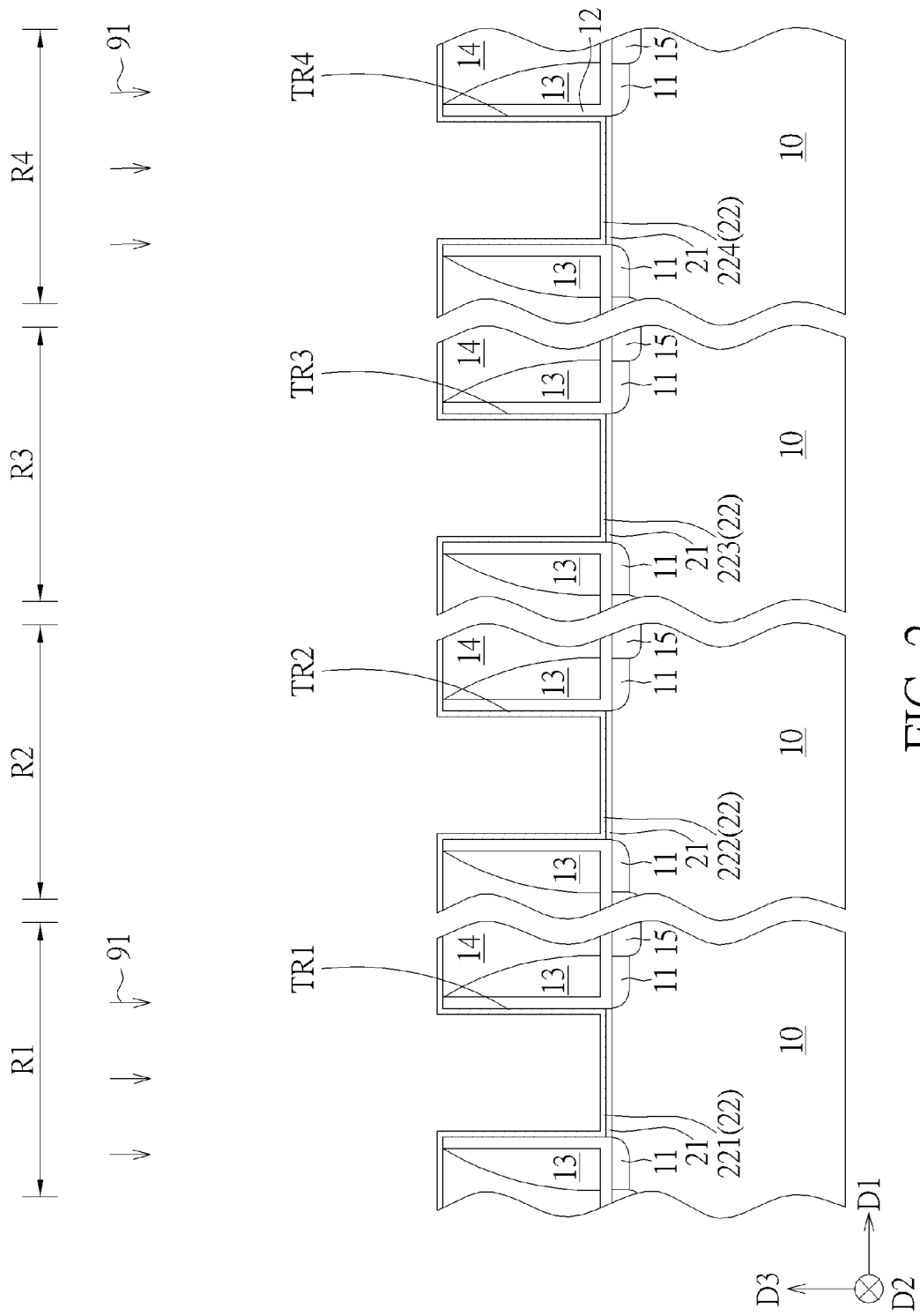

Please refer to FIGS. 1-11. FIG. 1 is a flow chart of a manufacturing method of a semiconductor device according to a first embodiment of the present invention. FIGS. 2-11 are schematic drawings illustrating the manufacturing method of the semiconductor device in this embodiment. The manufacturing method of the semiconductor device in this embodiment includes the following steps. As shown in FIG. 1 and FIG. 2, in step S1, a semiconductor substrate 10 is provided. The semiconductor substrate 10 in this embodiment may include a silicon substrate, an epitaxial silicon substrate, a silicon germanium substrate, a silicon carbide substrate, or a silicon-on-insulator (SOI) substrate, but not limited thereto. In some embodiments, the semiconductor substrate 10 may include a plurality of fin structures (not shown). Each of the fin structures may be elongated in a first direction D1, and the fin structures may be repeatedly disposed in a second direction D2, but not limited thereto. A first region R1, a second region R2, a third region R3, and a fourth region R4 may be defined on the semiconductor substrate 10. The first region R1, the second region R2, the third region R3, and the fourth region R4 may be regions for forming transistors having different conductivity types and/or different threshold voltages, but not limited thereto. For example, the first region R1 may be a low threshold voltage N type transistor region, the second region R2 may be a standard threshold voltage N type transistor region, the third region R3 may be a standard threshold voltage P type transistor region, and the fourth region R4 may be a low threshold voltage P type transistor region, but not limited thereto. A dielectric layer including an interlayer dielectric 14 may be formed on the semiconductor substrate 10, and the dielectric layer may include a first gate trench TR1 and a second gate trench TR2 formed in the first region R1 and the second region R2 respectively. Additionally, the dielectric layer may further include a third gate trench TR3 and a fourth gate trench TR4 formed in the third region R3 and the fourth region R4 respectively, but not limited thereto.

The method of forming the first gate trench TR1, the second gate trench TR2, the third gate trench TR3, and the fourth gate trench TR4 may include but is not limited to the following steps. Firstly, a plurality of dummy gates (not shown) may be formed on the semiconductor substrate 10. A first spacer 12 formed on the dummy gates and the semiconductor substrate 10 may be used to form a plurality of lightly doped regions 11 in the semiconductor substrate 10. A second spacer 13 formed on the first spacer 12 may be used to form a plurality of source/drain regions 15 in the semiconductor substrate 10. The dummy gates are removed after the step of forming the interlayer dielectric 14 for forming gate trenches, such as the first gate trench TR1, the second gate trench TR2, the third gate trench TR3, and the fourth gate trench TR4. The gate trenches may be filled with gate material layers, such as gate dielectric layers, barrier layers, work function layers, and low resistivity layers for forming gate stacks of different transistors. For example, in step S2, an interfacial layer 21 may be formed in the first gate trench TR1, the second gate trench TR2, the third gate trench TR3, and the fourth gate trench TR4. In step S3, a gate dielectric layer 22 is conformally formed on the semiconductor substrate 10. Specifically, the gate dielectric layer 22 may include a first gate dielectric layer 221 and a second gate dielectric layer 222. The first gate dielectric layer 221 is formed in the first region R1 and at least partly formed in the first gate trench TR1. The second gate dielectric layer 222 is formed in the second region R2 and at least partly formed in the second gate trench TR2. Additionally, the gate dielectric layer 22 may further include a third gate dielectric layer 223 formed in the third gate trench TR3 and a fourth gate dielectric layer 224 formed in the fourth gate trench TR4. The gate dielectric layer 22 may include high dielectric constant (high-k) materials, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), and zirconium oxide ($ZrO_2$).

Figure 3:
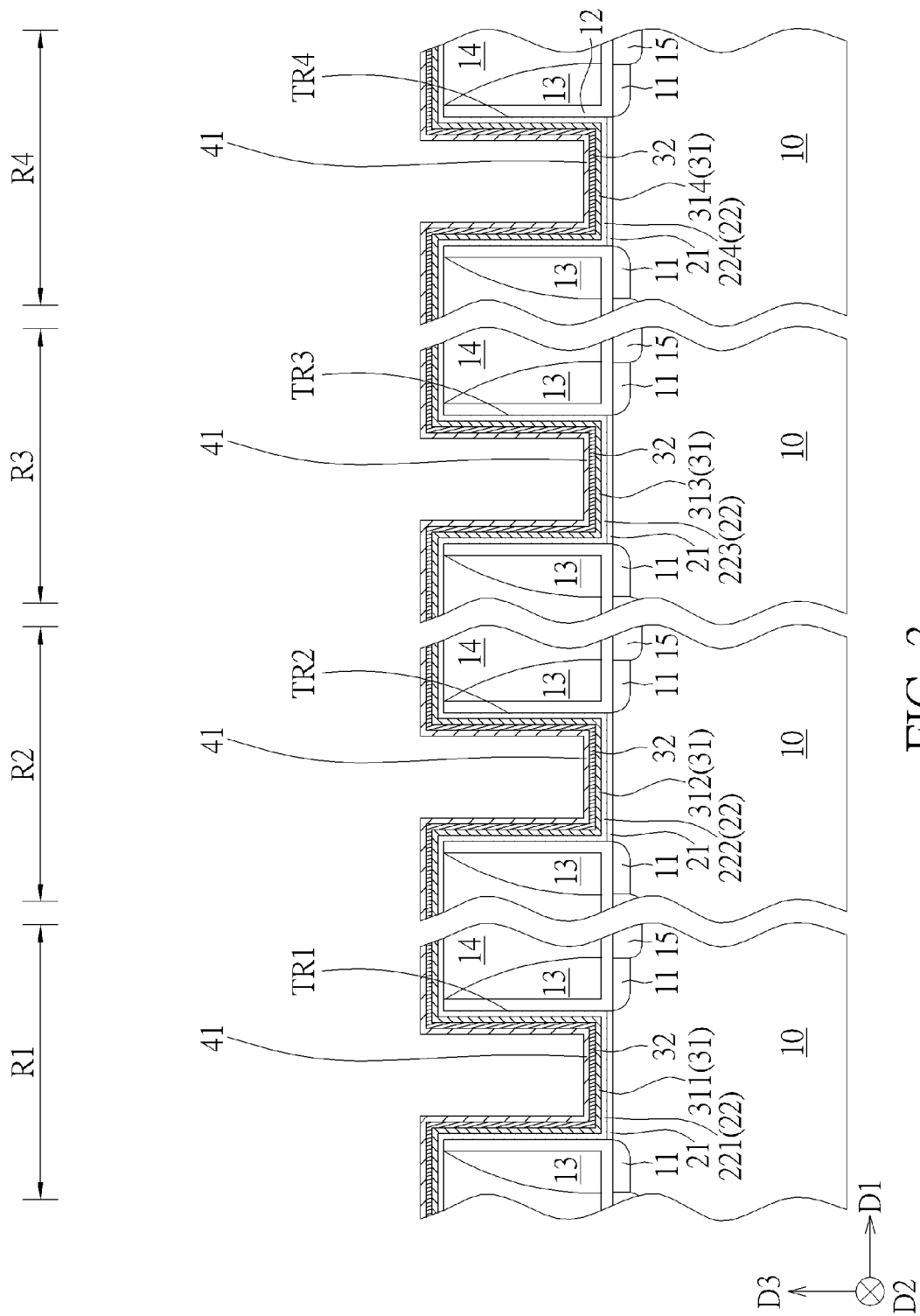

As shown in FIG. 1 and FIG. 3, in step S4, a first bottom barrier layer 31 is formed on the gate dielectric layer 22. Specifically, the first bottom barrier layer 31 may include a first part 311 formed on the first gate dielectric layer 221 and a second part 312 formed on the second gate dielectric layer 222. Additionally, the first bottom barrier layer 31 may further include a third part 313 formed on the third gate dielectric layer 223 and a fourth part 314 formed on the fourth gate dielectric layer 224. The first bottom barrier layer 31 is formed conformally on the gate dielectric layer 22 preferably.

As shown in FIG. 1 and FIGS. 3-7, in step S7, a first conductivity type work function layer 40 is formed on the first bottom barrier layer 31. In some embodiments, a second bottom barrier layer 32 may be formed on the first bottom barrier layer 31 (such as step S6) before the step of forming the first conductivity type work function layer 40, but not limited thereto. The first bottom barrier layer 31 may be different from the second bottom barrier layer 32. For example, the first bottom barrier layer 31 may include titanium nitride (TiN), and the second bottom barrier layer may include tantalum nitride (TaN), but not limited thereto. In some embodiments of the present invention, the first bottom barrier layer 31 and the second bottom barrier layer 32 may include other suitable barrier metal materials. As shown in FIG. 2 and FIG. 3, in some embodiments, a first treatment 91 to the first gate dielectric layer 221 may be performed before the step of forming the first conductivity type work function layer. The first treatment 91 may be performed locally to the first region R1, and the second gate dielectric layer 222 in the second region R2 may not be treated by the first treatment 91. A component of the first gate dielectric layer 221 is different from a component of the second gate dielectric layer 222 after the first treatment 91. The first treatment 91 may include adding a dopant in the first gate dielectric layer 221, and the dopant may include lanthanum (La) or other suitable materials for changing the effective work function (eWF) of the first gate dielectric layer 221. In other words, the effective work function of the first gate dielectric layer 221 is different from the effective work function of the second gate dielectric layer 222 after the first treatment 91. For example, the lanthanum concentration in the first gate dielectric layer 221 may be higher than the second gate dielectric layer 222 after the first treatment 91, and the effective work function of the first gate dielectric layer 221 may be lower than that of the second gate dielectric layer 222 after the first treatment 91, but not limited thereto. Additionally, the first treatment 91 may include an in-situ treatment performed in the step of forming the first gate dielectric layer 221, but not limited thereto. In some embodiments, the first treatment 91 may be further performed to the fourth gate dielectric layer 224, and a component of the fourth gate dielectric layer 224 may be different from the component of the second gate dielectric layer 222 after the first treatment 91. Specifically, the first treatment 91 may be locally performed to the first gate dielectric layer 221 and the fourth gate dielectric layer 224 without influencing the second gate dielectric layer 222 and the third gate dielectric layer 223. Accordingly, the effective work function of the first gate dielectric layer 221 and the fourth gate dielectric layer 224 will be different from the effective work function of the second gate dielectric layer 222 and the third gate dielectric layer 223 after the first treatment 91.

As shown in FIGS. 1-3, in step S5, an annealing process may be performed after the first treatment 91 and before the step of forming the second bottom barrier layer 32. The annealing process may include a soak annealing process, a spike annealing process, or other appropriate annealing processes. In some embodiments, the annealing process may include an in-situ annealing process in the step of forming the first bottom barrier layer 31, but not limited thereto. The annealing process may be used to activate the dopant doped in the first gate dielectric layer 221 and/or the fourth gate dielectric layer 224.

Figure 4:
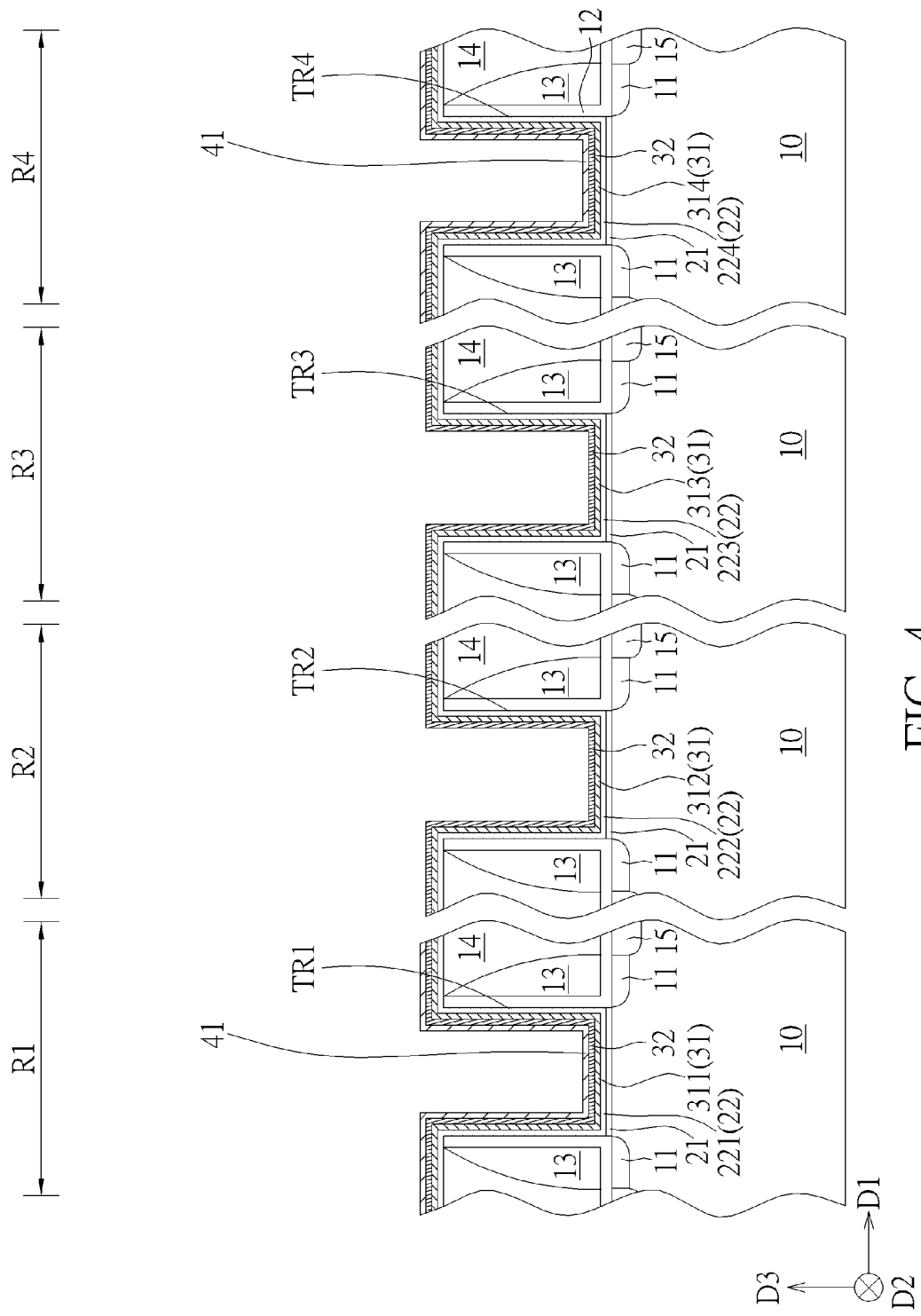
Figure 5:
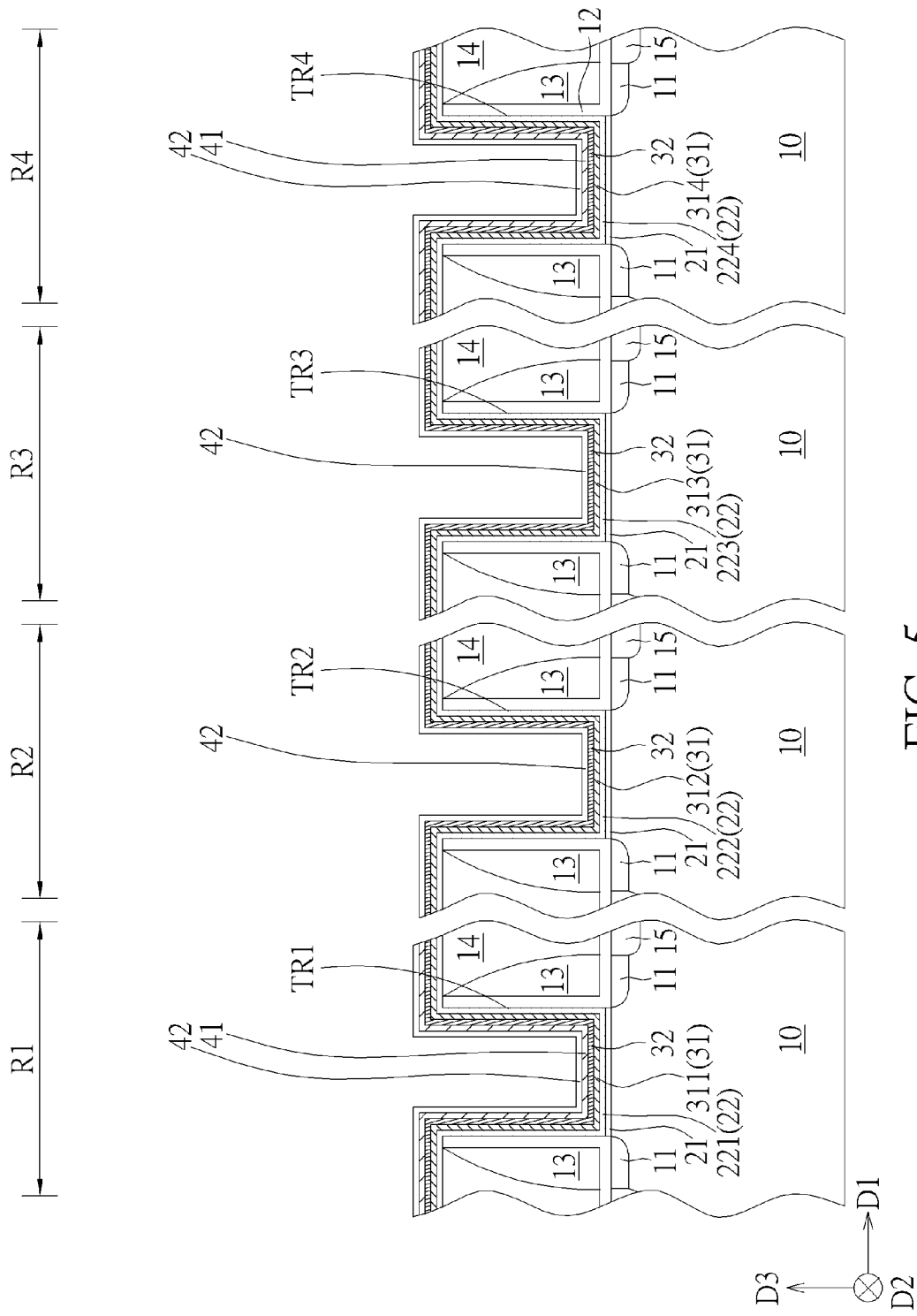
Figure 6:
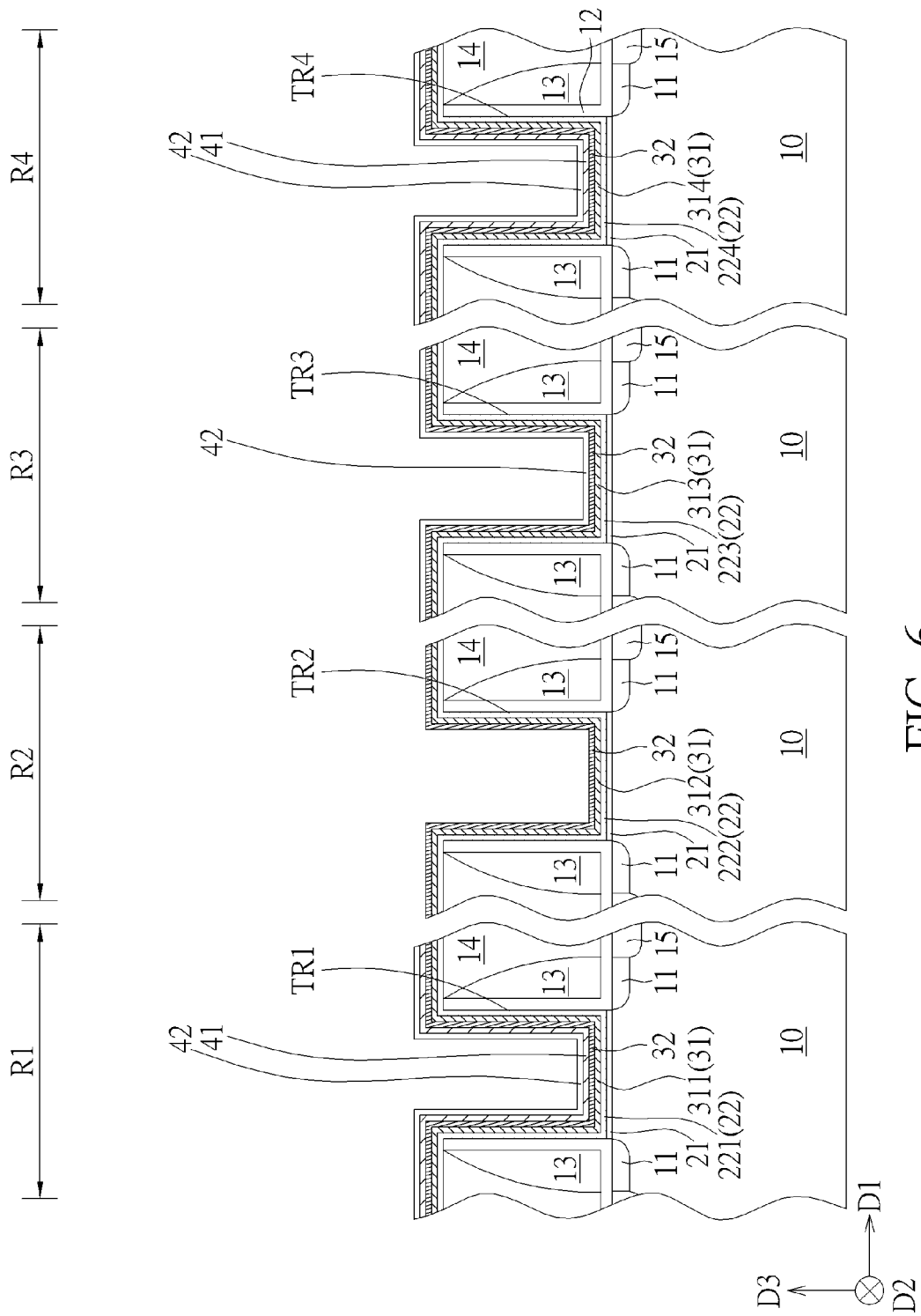
Figure 7:
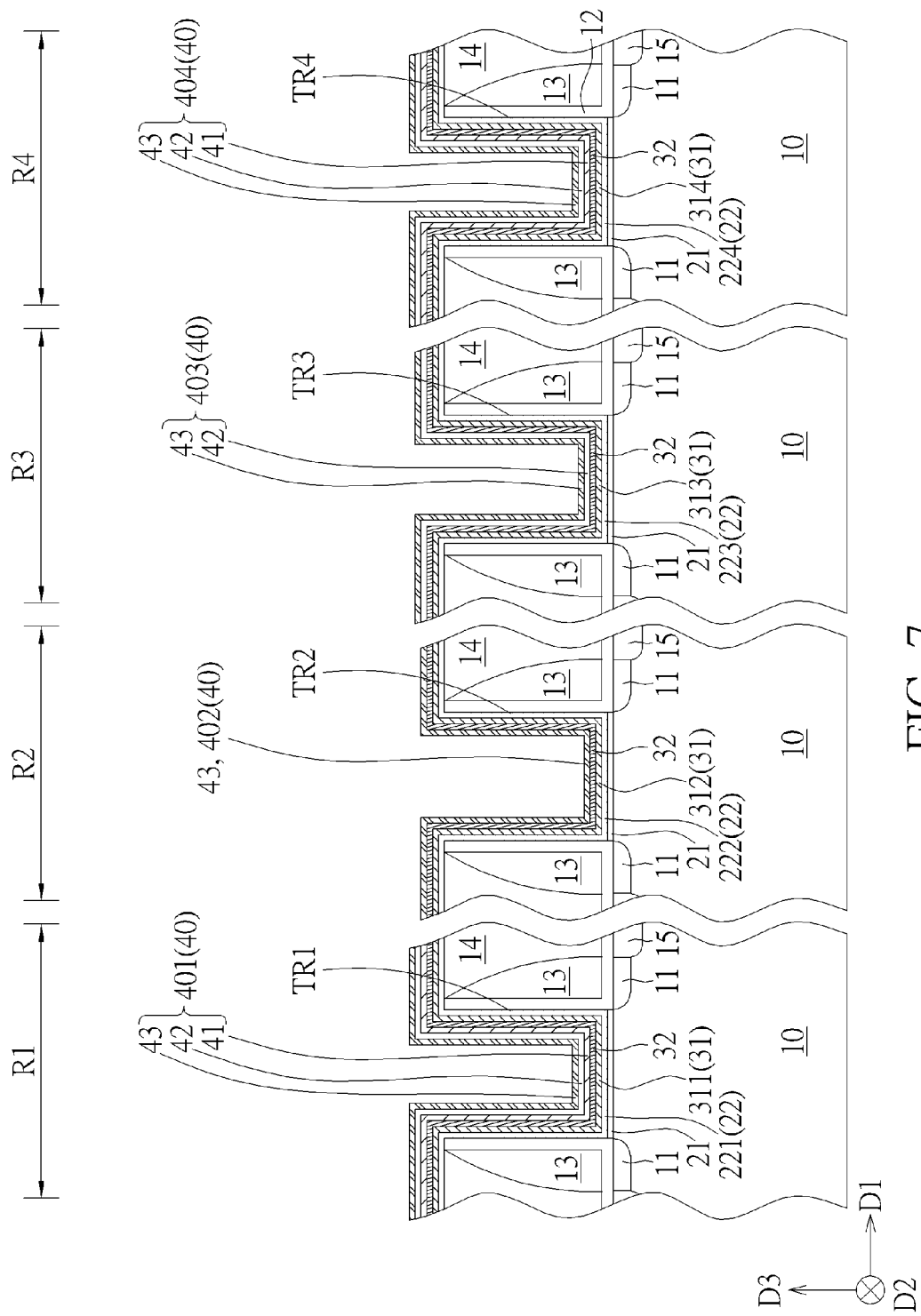

In some embodiments, the first conductivity type work function layer 40 may include a first part 401 formed on the first bottom barrier layer 31 in the first gate trench TR1, a second part 402 formed on the first bottom barrier layer 31 in the second gate trench TR2, a third part 403 formed on the first bottom barrier layer 31 in the third gate trench TR3, and a fourth part 404 formed on the first bottom barrier layer 31 in the fourth gate trench TR4. The second part 402 is thinner than the third part 403, and the third part 403 is thinner than the first part 401 and the fourth part 404. The method of forming the first conductivity type work function layer 40 may include but is not limited to the following steps. As shown in FIG. 3, a first work function layer 41 is conformally formed on the first bottom barrier layer 31 in the first gate trench TR1, the second gate trench TR2, the third gate trench TR3, and the fourth gate trench TR4. As shown in FIG. 3 and FIG. 4, the first work function layer 41 in the second gate trench TR2 and the third gate trench TR3 is removed. Specifically, the first work function layer 41 in the second region R2 and the third region R3 may be removed by an etching process with a mask covering the first work function layer 41 in the first region R1 and the fourth region R4 in a vertical direction D3. As shown in FIG. 5, a second work function layer 42 is conformally formed in the first gate trench TR1, the second gate trench TR2, the third gate trench TR3, and the fourth gate trench TR4 after the step of removing the first work function layer 41 in the second gate trench TR2 and the third gate trench TR3. Specifically, the second work function layer 42 is formed on the first work function layer 41 in the first region R1, the second bottom barrier layer 32 in the second region R2, the second bottom barrier layer 32 in the third region R3, and the first work function layer 41 in the fourth region R4. As shown in FIG. 5 and FIG. 6, the second work function layer 42 in the second gate trench TR2 is removed. The second work function layer 42 in the second region R2 may be removed by an etching process with a mask covering the first work function layer 41 in the first region R1, the third region R3, and the fourth region R4. Subsequently, as shown in FIG. 6 and FIG. 7, a third work function layer 43 is conformally formed in the first gate trench TR1, the second gate trench TR2, the third gate trench TR3, and the fourth gate trench TR4 after the step of removing the second work function layer 42 in the second gate trench TR2. In some embodiments, the first work function layer 41, the second work function layer 42, and the third work function layer 43 may be the same work function material, such as titanium nitride, but not limited thereto. In some embodiments, the first work function layer 41, the second work function layer 42, and the third work function layer 43 may also include other suitable work function materials (such as titanium carbide, TiC), and the materials of the first work function layer 41, the second work function layer 42, and the third work function layer 43 may also be different from one another according to other considerations.

By the method described above, the first part 401 of the first conductivity type work function layer 40 may be composed of the first work function layer 41, the second work function layer 42, and the third work function layer 43 in the first region R1; the second part 402 of the first conductivity type work function layer 40 may be composed of the third work function layer 43 in the second region R1 only; the third part 403 of the first conductivity type work function layer 40 may be composed of the second work function layer 42 and the third work function layer 43 in the third region R3; and the fourth part 404 of the first conductivity type work function layer 40 may be composed of the first work function layer 41, the second work function layer 42, and the third work function layer 43 in the fourth region R4. Accordingly, the second part 402 is thinner than the third part 403, and the third part 403 is thinner than the first part 401 and the fourth part 404. Additionally, a thickness of the first part 401 of the first conductivity type work function layer 40 may be substantially equal to a thickness of the fourth part 404 of the first conductivity type work function layer 40, but not limited thereto.

Figure 8:
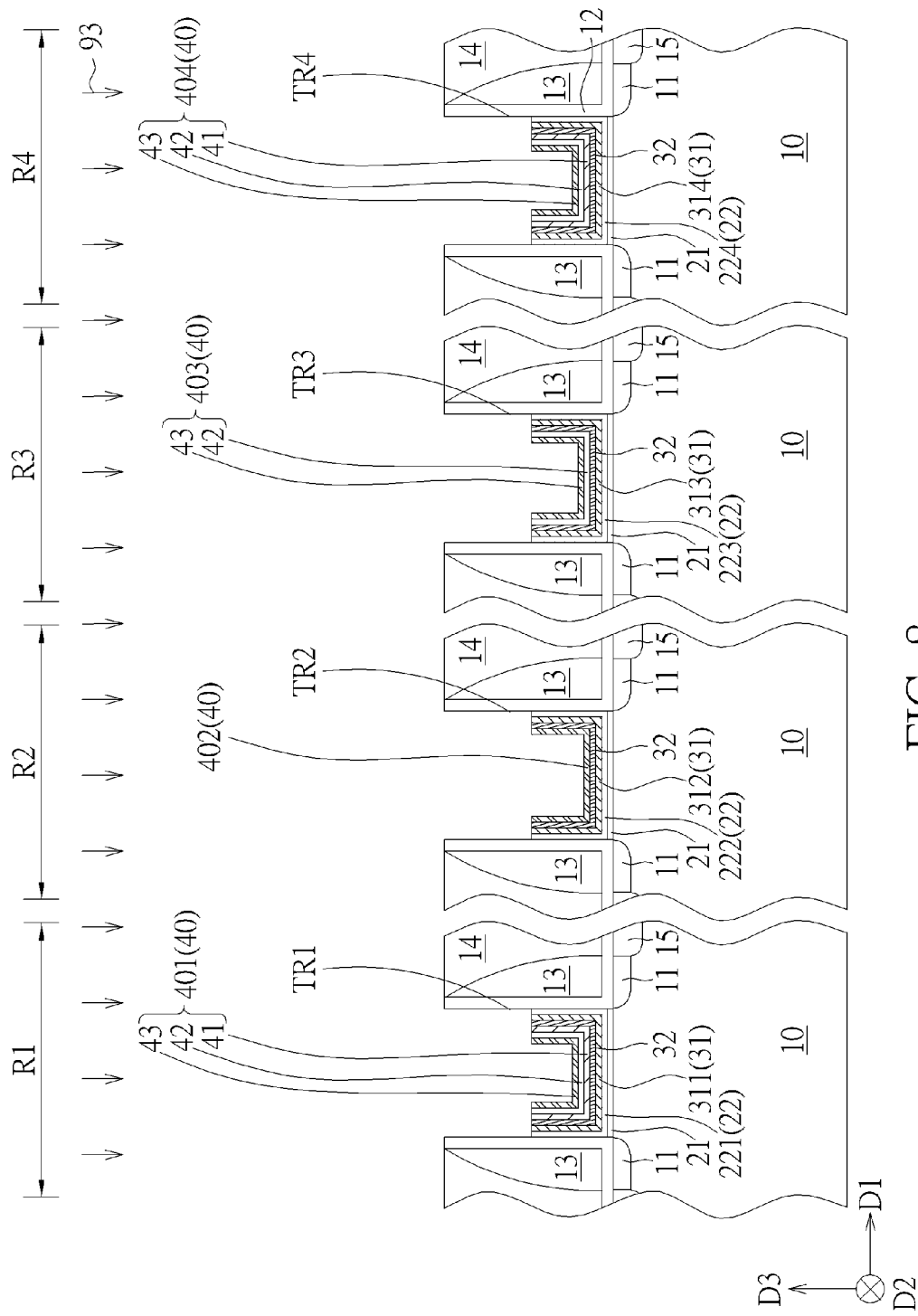
Figure 9:
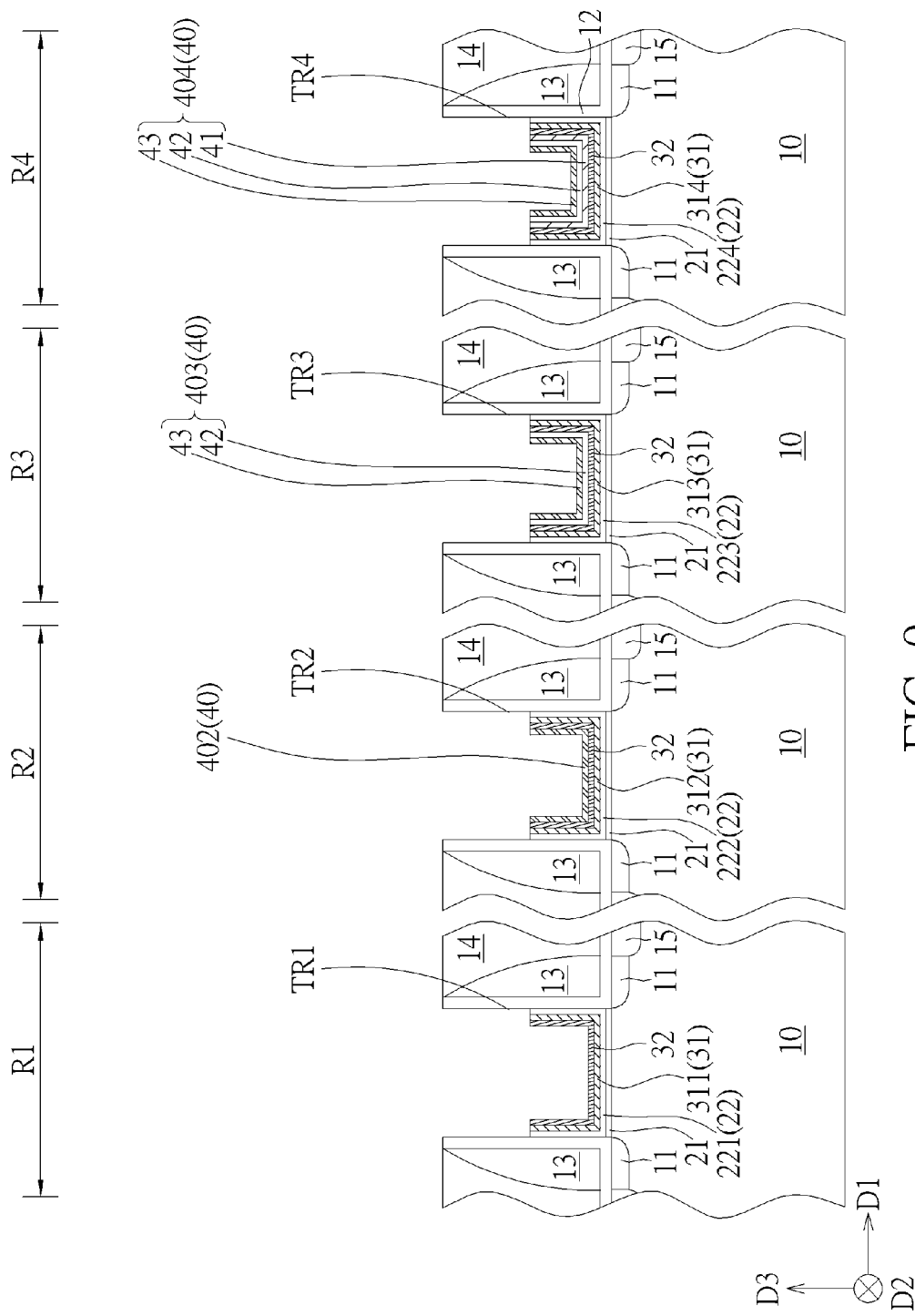

As shown in FIGS. 7-9, the first conductivity type work function layer 40 in the first gate trench TR1 is removed. Specifically, the first part 401 of the first conductivity type work function layer 40 may be removed by an etching process with a mask covering the first conductivity type work function layer 40 in the second region R2, the third region R3, and the fourth region R4 after the step of forming the third work function layer 43. Additionally, as shown in FIG. 8, a recessing process 93 may be performed optionally for removing a part of the gate dielectric layer 22, a part of the first bottom barrier layer 31, a part of the second bottom barrier layer 32, and a part of the first conductivity type work function layer 40. Topmost surfaces of the gate dielectric layer 22, the first bottom barrier layer 31, the second bottom barrier layer 32, and the first conductivity type work function layer 40 will be lower than a topmost part of the gate trenches after the recessing process 93. The step of removing the first part 401 of the first conductivity type work function layer 40 in the first region R1 may be performed after the recessing process 93 preferably for the consideration of etching loading effect, but not limited thereto.

As shown in FIG. 1 and FIGS. 8-10, in step S8, a second conductivity type work function layer 50 is conformally formed in the first region R1, the second region R2, the third region R3, and the fourth region R4 after the step of removing the first part 401 of the first conductivity type work function layer 40 in the first region R1. Specifically, the second conductivity type work function layer 50 may include a first part 501 formed on the first bottom barrier layer 31 in the first gate trench TR1, a second part 502 formed on the first conductivity type work function layer 40 in the second gate trench TR2, a third part 503 formed on the first conductivity type work function layer 40 in the third gate trench TR3, and a fourth part 504 formed on the first conductivity type work function layer 40 in the fourth gate trench TR4. In some embodiments, the first conductivity type work function layer 40 may include a P type work function layer and the second conductivity type work function layer 50 may include an N type work function layer, but not limited thereto. For example, the second conductivity type work function layer 50 may include titanium aluminum carbide (TiAlC) or other suitable N type work function materials (such as titanium aluminide, TiAl). Subsequently, in step S9, a top barrier layer 60 is conformally formed on the second conductivity type work function layer 50. In step S10, a low resistivity layer 70 is formed on the top barrier layer 60. The top barrier layer 60 may include titanium nitride or other suitable barrier materials. The low resistivity layer 70 may include conductive materials with low resistivity, such as aluminum (Al), tungsten (W), copper (Cu), and titanium aluminide (TiAl). Additionally, the low resistivity layer 70 may include materials with great gap-filling ability preferably for effectively forming in the gate trenches.

Figure 10:
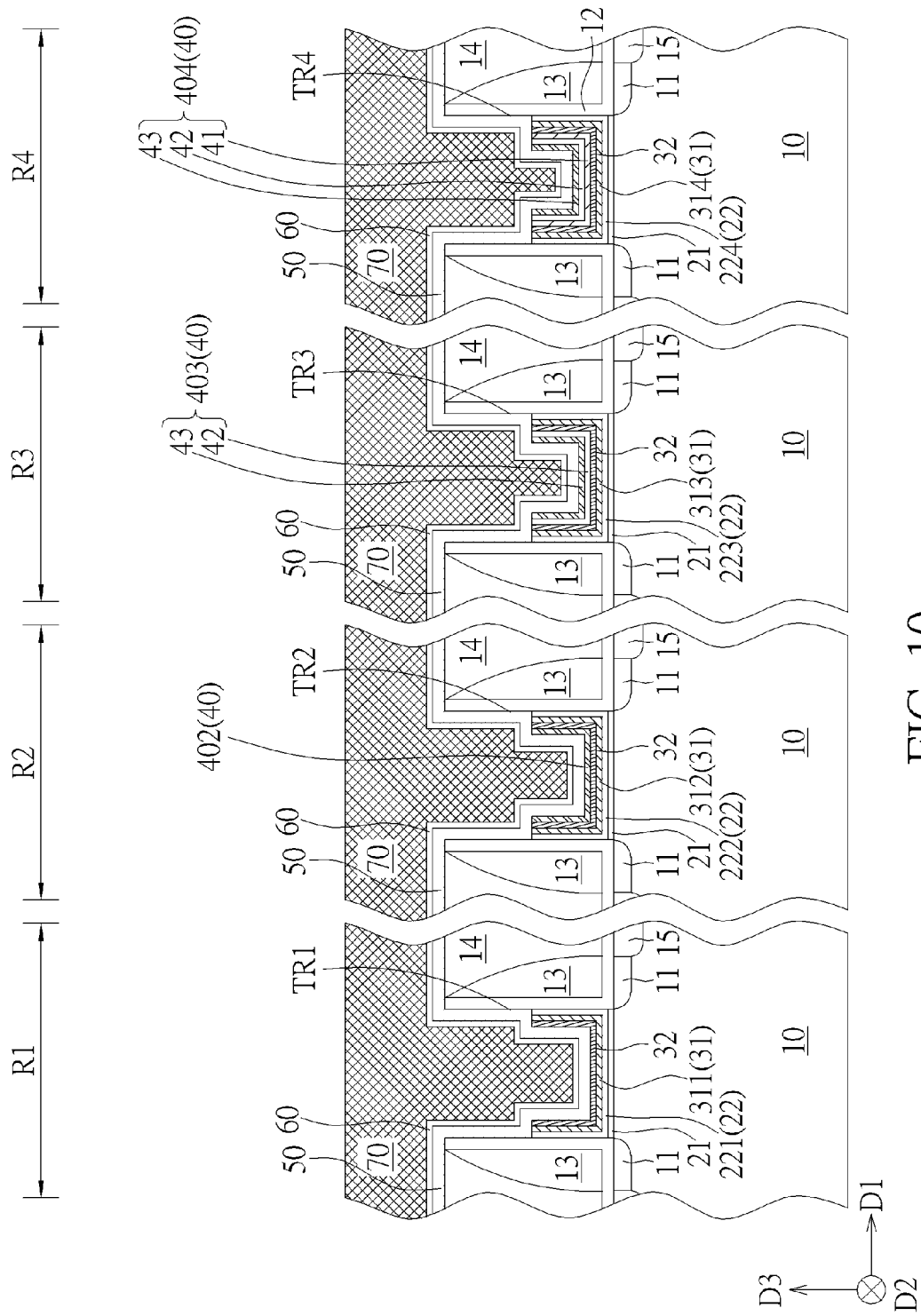
Figure 11:
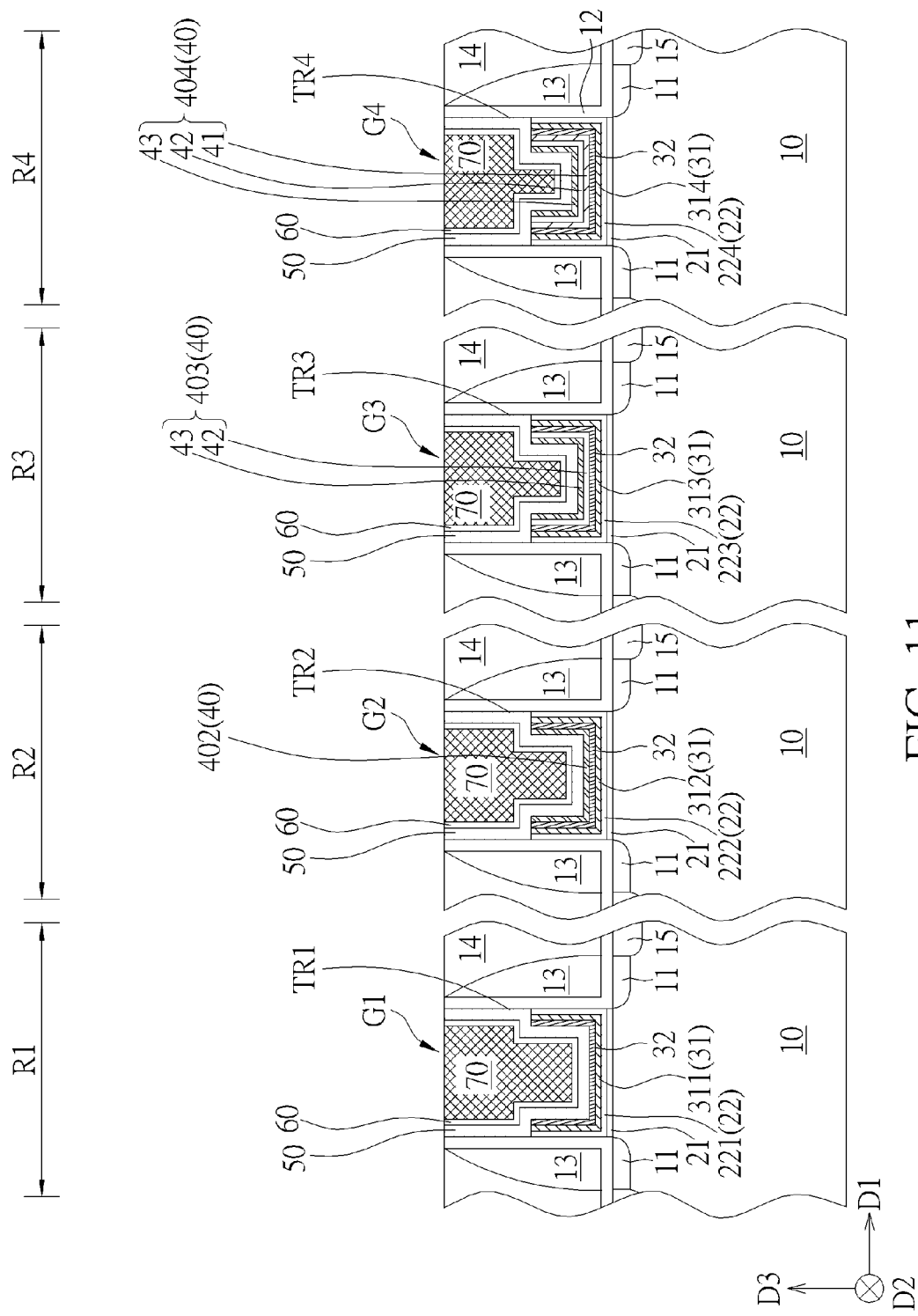

As shown in FIG. 10 and FIG. 11, a planarization process may be performed to remove a part of the low resistivity layer 70, a part of the top barrier layer 60, and a part of the second conductivity type work function layer 50 outside the gate trenches for forming a first gate structure G1 in the first region R1, a second gate structure G2 in the second region R2, a third gate structure G3 in the third region R3, and a fourth gate structure G4 in the fourth region R4. The planarization process mentioned above may include a chemical mechanical polishing (CMP) process, an etching back process, or other suitable planarization approaches. In some embodiments, the first gate structure G1 including the interfacial layer 21, the first gate dielectric layer 221, the first part 311 of the first bottom barrier layer 31, the second bottom barrier layer 32, the second conductivity type work function layer 50, the top barrier layer 60, and the low resistivity layer 70 may be a gate structure of a low threshold voltage N type transistor; the second gate structure G2 including the interfacial layer 21, the second gate dielectric layer 222, the second part 312 of the first bottom barrier layer 31, the second bottom barrier layer 32, the second part 402 of the first conductivity type work function layer 40, the second conductivity type work function layer 50, the top barrier layer 60, and the low resistivity layer 70 may be a gate structure of a standard threshold voltage N type transistor;

the third gate structure G3 including the interfacial layer 21, the third gate dielectric layer 223, the third part 313 of the first bottom barrier layer 31, the second bottom barrier layer 32, the third part 403 of the first conductivity type work function layer 40, the second conductivity type work function layer 50, the top barrier layer 60, and the low resistivity layer 70 may be a gate structure of a standard threshold voltage P type transistor; the fourth gate structure G3 including the interfacial layer 21, the fourth gate dielectric layer 224, the fourth part 314 of the first bottom barrier layer 31, the second bottom barrier layer 32, the fourth part 404 of the first conductivity type work function layer 40, the second conductivity type work function layer 50, the top barrier layer 60, and the low resistivity layer 70 may be a gate structure of a low threshold voltage P type transistor, but not limited thereto.

It is worth noting that the component of the first gate dielectric layer 221 and the component of the fourth gate dielectric layer 224 are different from the component of the second gate dielectric layer 222 and the component of the third gate dielectric layer 223 because of the first treatment described above, and the effective work function of the first gate dielectric layer 221 and the fourth gate dielectric layer 224 may be different from the effective work function of the second gate dielectric layer 222 and the third gate dielectric layer 223. Accordingly, the thicknesses of the first conductivity type work function layer 40 and the second conductivity type work function layer 50 may be modified for reducing the total thickness of the work function layers because of the compensation provided by the first treatment. For example, the thickness of the second conductivity type work function layer 50 may be reduced from 50 angstroms to 37 angstroms, the thickness of the first work function layer 41 may be increased from 15 angstroms to 16 angstroms, the thickness of the second work function layer 42 may be increased from 10 angstroms to 11 angstroms, and the thickness of the third work function layer 43 may be increased from 15 angstroms to 16 angstroms. Accordingly, the total thickness of the first conductivity type work function layer 40 and the second conductivity type work function layer 50 in the fourth gate structure G4 may be reduced by 10 angstroms, and the low resistivity layer 70 may be formed into the fourth gate trench TR4 more easily and effectively. Additionally, the fourth part 404 of the first conductivity type work function layer 40 may be thicker than the second conductivity type work function layer 50 after the thickness modification described above. The influence of the thickness change on the threshold voltage may be more obvious in the first gate structure G1 and the fourth gate structure G4, and the first treatment may be used to compensate the threshold voltage shift and maintain the desired threshold voltage in the transistors including the first gate structure G1 and the fourth gate structure G4. Accordingly, the related process window may be improved without influencing the electrical performance.

Figure 12:
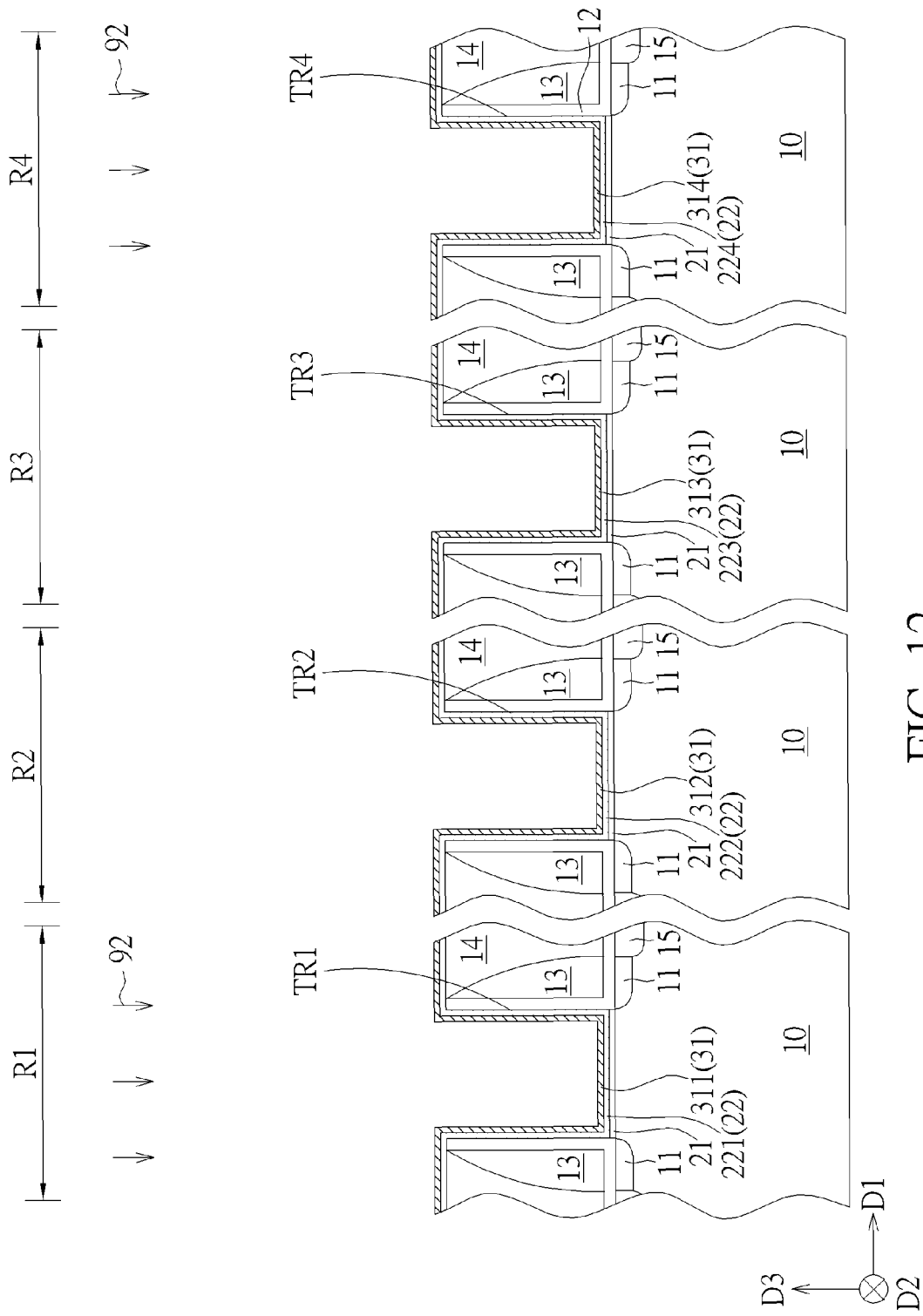
FIG. 12 is a schematic drawing illustrating a manufacturing method of a semiconductor device according to a second embodiment of the present invention.

Please refer to FIG. 1 and FIG. 12. FIG. 12 is a schematic drawing illustrating a manufacturing method of a semiconductor device according to a second embodiment of the present invention. As shown in FIG. 1 and FIG. 12, the manufacturing method in the this embodiment may further include performing a second treatment 92 to the first bottom barrier layer 31 on the first gate dielectric layer 221 before the step of forming the first conductivity type work function layer. The second treatment 92 may be performed locally to the first region R1, and the second part 312 of the first bottom barrier layer 312 in the second region R2 may not be treated by the second treatment 92. A component of the first bottom barrier layer 31 on the first gate dielectric layer 221 is different from a component of the first bottom barrier layer 31 on the second gate dielectric layer 222 after the second treatment 92. In some embodiments, the second treatment 92 may include adding a dopant in the first bottom barrier layer 31 on the first gate dielectric layer 221, and the dopant may include aluminum (Al) or other suitable materials for changing the effective work function of the first part 311 of the first bottom barrier layer 31. In other words, the effective work function of the first part 311 of the first bottom barrier layer 31 is different from the effective work function of the second part 312 of the first bottom barrier layer 31 after the second treatment 92.

For example, the aluminum concentration in the first part 311 of the first bottom barrier layer 31 may be higher than the second part 312 of the first bottom barrier layer 31 after the second treatment 91, and the effective work function of the first part 311 of the first bottom barrier layer 31 may be lower than that of the second part 312 of the first bottom barrier layer 31 after the second treatment 91, but not limited thereto. Additionally, the second treatment 92 may include an in-situ treatment performed in the step of forming the first bottom barrier layer 31 on the first gate dielectric layer 221, but not limited thereto. In some embodiments, the second treatment 92 may be further performed to the first bottom barrier layer 31 on the fourth gate dielectric layer 224, and a component of the fourth part 314 of the first bottom barrier layer 31 may be different from the component of the second part 312 of the first bottom barrier layer 31 after the second treatment 92. Specifically, the second treatment 92 may be locally performed to the first part 311 and the fourth part 314 of the first bottom barrier layer 31 without influencing the second part 312 and the third part 313 of the first bottom barrier layer 31. Accordingly, the effective work function of the first part 311 and the fourth part 314 of the first bottom barrier layer 31 will be different from the effective work function of the second part 312 and the third part 313 of the first bottom barrier layer 31 after the second treatment 92. Additionally, in some embodiments, the second treatment 92 may be performed before the step of forming the second bottom barrier layer, and the annealing process performed after the step of forming the second bottom barrier layer may be used to activate the dopant doped in the first part 311 and/or the fourth part 314 of the first bottom barrier layer 31. It is worth noting that, in some embodiments, the manufacturing method may include the second treatment 92 and the first treatment described in the first embodiment. However, in some embodiments, the manufacturing method may include only one of the first treatment or the second treatment 92.

Figure 13:
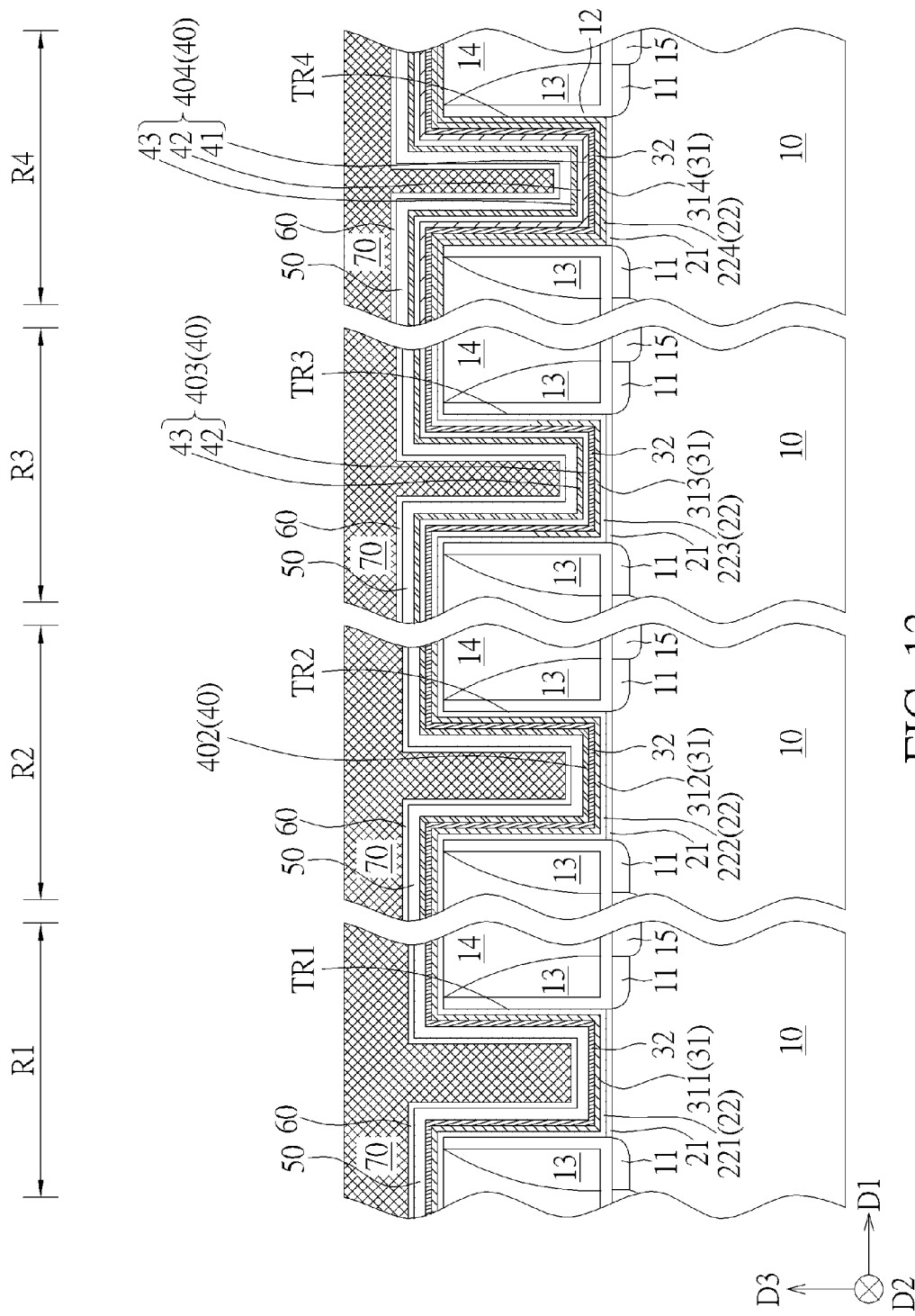
Figure 14:
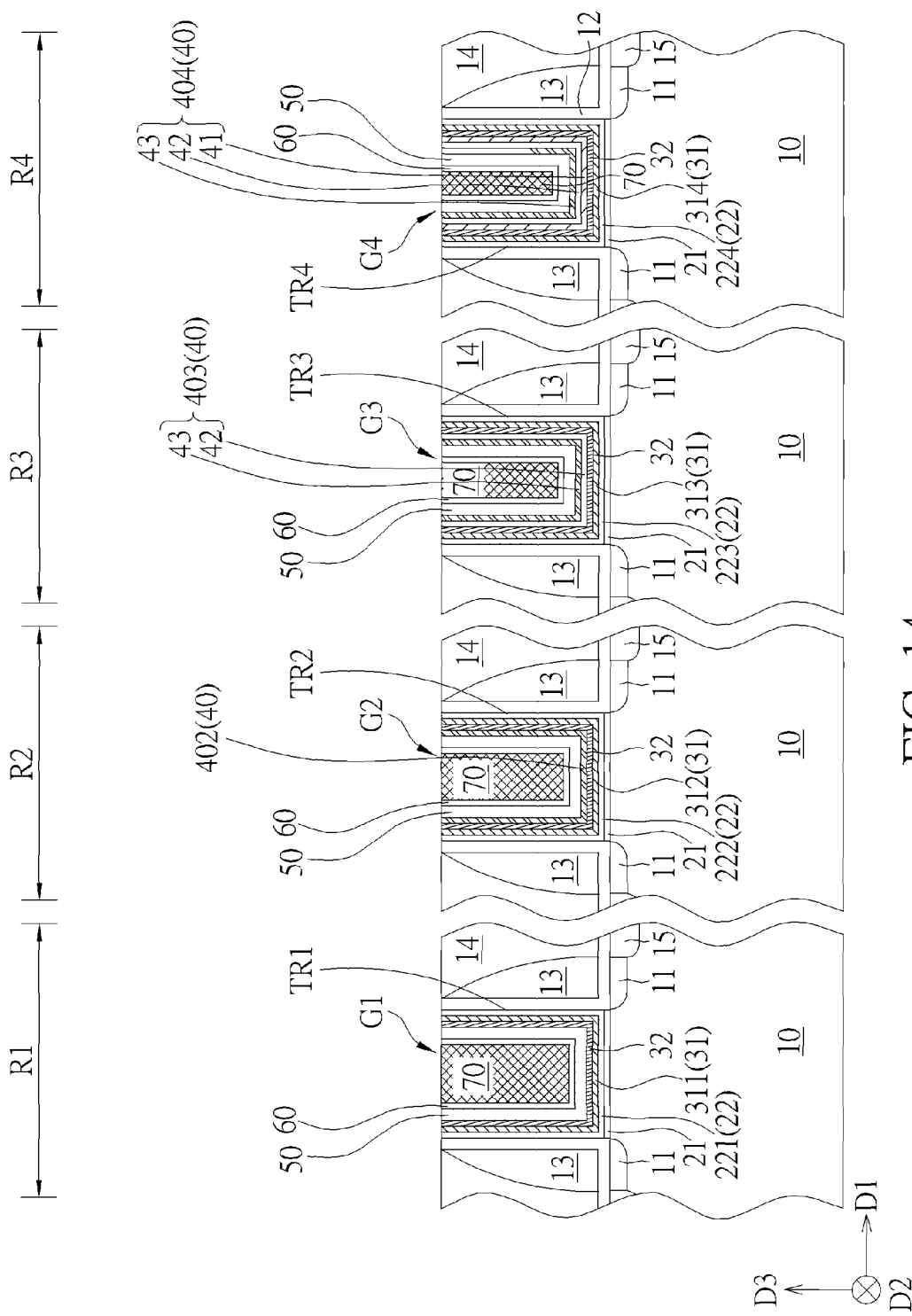

Please refer to FIG. 13 and FIG. 14. FIG. 13 and FIG. 14 are schematic drawings illustrating a manufacturing method of a semiconductor device according to a third embodiment of the present invention. As shown in FIG. 13 and FIG. 14, the difference between the manufacturing method in this embodiment and the manufacturing method in the first embodiment is that the manufacturing method in this embodiment does not include the recessing process 93 shown in FIG. 8. Accordingly, the planarization process in this embodiment is performed for removing a part of the low resistivity layer 70, a part of the top barrier layer 60, a part of the second conductivity type work function layer 50, a part of the first conductivity type work function layer 40, a part of the second bottom barrier layer 32, a part of the first bottom barrier layer 31, and a part of the gate dielectric layer 22 outside the gate trenches for forming the first gate structure G1, the second gate structure G2, the third gate structure G3, and the fourth gate structure G4. The total thickness of the first conductivity type work function layer 40 and the second conductivity type work function layer 50 in the fourth gate structure G4 may be reduced because of the threshold voltage compensation generated by the first treatment and/or the second treatment mentioned above, and the low resistivity layer 70 may be formed into the fourth gate trench TR4 more effectively without performing the recessing process described above.

To summarize the above descriptions, in the manufacturing method of the semiconductor device according to the present invention, the treatment to the gate dielectric layer and/or the treatment to the bottom barrier layer may be performed locally for modifying the threshold voltages of specific transistors, and the total thicknesses of the work function layers may be reduced for increasing the related process window.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor device, comprising:
   providing a semiconductor substrate;
   forming a dielectric layer on the semiconductor substrate, wherein the dielectric layer comprises a first gate trench and a second gate trench;
   forming a first gate dielectric layer in the first gate trench and a second gate dielectric layer in the second gate trench;
   forming a first bottom barrier layer on the first gate dielectric layer and the second gate dielectric layer;
   forming a first conductivity type work function layer on the first bottom barrier layer;
   removing the first conductivity type work function layer in the first gate trench;
   forming a second conductivity type work function layer on the first bottom barrier layer in the first gate trench and on the first conductivity type work function layer in the second gate trench; and
   performing a first treatment to the first gate dielectric layer and/or a second treatment to the first bottom barrier layer on the first gate dielectric layer before the step of forming the first conductivity type work function layer, wherein a component of the first gate dielectric layer is different from a component of the second gate dielectric layer after the first treatment, and/or a component of the first bottom barrier layer on the first gate dielectric layer is different from a component of the first bottom barrier layer on the second gate dielectric layer after the second treatment.

2. The manufacturing method of claim 1, wherein the first treatment comprising adding a dopant in the first gate dielectric layer.

3. The manufacturing method of claim 2, wherein the dopant comprises lanthanum.

4. The manufacturing method of claim 1, wherein the first treatment comprising an in-situ treatment performed in the step of forming the first gate dielectric layer.

5. The manufacturing method of claim 1, wherein the second treatment comprising adding a dopant in the first bottom barrier layer on the first gate dielectric layer.

6. The manufacturing method of claim 5, wherein the dopant comprises aluminum.

7. The manufacturing method of claim 1, wherein the second treatment comprising an in-situ treatment performed in the step of forming the first bottom barrier layer on the first gate dielectric layer.

8. The manufacturing method of claim 1, wherein an effective work function (eWF) of the first bottom barrier layer on the first gate dielectric layer is lower than an effective work function of the first bottom barrier layer on the second gate dielectric layer after the second treatment.

9. The manufacturing method of claim 1, wherein the dielectric layer further comprising a third gate trench and a fourth gate trench, and the manufacturing method further comprising:
   forming a third gate dielectric layer in the third gate trench and a fourth gate dielectric layer in the fourth gate trench, wherein the first bottom barrier layer is further formed on the third gate dielectric layer and the fourth gate dielectric layer, and the first conductivity type work function layer comprises:
   a first part formed on the first bottom barrier layer in the first gate trench;
   a second part formed on the first bottom barrier layer in the second gate trench;
   a third part formed on the first bottom barrier layer in the third gate trench; and
   a fourth part formed on the first bottom barrier layer in the fourth gate trench, wherein the second part is thinner than the third part, and the third part is thinner than the first part and the fourth part.

10. The manufacturing method of claim 9, wherein the step of forming the first conductivity type work function layer comprises:
   forming a first work function layer on the first bottom barrier layer in the first gate trench, the second gate trench, the third gate trench, and the fourth gate trench;
   removing the first work function layer in the second gate trench and the third gate trench;
   forming a second work function layer in the first gate trench, the second gate trench, the third gate trench, and the fourth gate trench after the step of removing the first work function layer in the second gate trench and the third gate trench;
   removing the second work function layer in the second gate trench; and
   forming a third work function layer in the first gate trench, the second gate trench, the third gate trench, and the fourth gate trench after the step of removing the second work function layer in the second gate trench.

11. The manufacturing method of claim 10, wherein a thickness of the first part of the first conductivity type work function layer is equal to a thickness of the fourth part of the first conductivity type work function layer.

12. The manufacturing method of claim 11, wherein the first part of the first conductivity type work function layer is removed after the step of forming the third work function layer.

13. The manufacturing method of claim 9, wherein the second conductivity type work function layer is further formed on the first conductivity type work function layer in the third gate trench and the first conductivity type work function layer in the fourth gate trench.

14. The manufacturing method of claim 13, wherein the fourth part of the first conductivity type work function layer is thicker than the second conductivity type work function layer.

15. The manufacturing method of claim 8, wherein the first treatment is further performed to the fourth gate dielectric layer, and a component of the fourth gate dielectric layer is different from the component of the second gate dielectric layer after the first treatment.

16. The manufacturing method of claim 8, wherein the second treatment is further performed to the first bottom barrier layer on the fourth gate dielectric layer, and a component of the first bottom barrier layer on the fourth gate dielectric layer is different from the component of the first bottom barrier layer on the second gate dielectric layer after the second treatment.

17. The manufacturing method of claim 1, further comprising:
    forming a second bottom barrier layer on the first bottom barrier layer before the step of forming the first conductivity type work function layer.

18. The manufacturing method of claim 17, wherein the second treatment is performed before the step of forming the second bottom barrier layer.

19. The manufacturing method of claim 17, further comprising:
    performing an annealing process after the first treatment and/or the second treatment and before the step of forming the second bottom barrier layer.

20. The manufacturing method of claim 1, wherein the first conductivity type work function layer comprises a P type work function layer and the second conductivity type work function layer comprises an N type work function layer.

* * * * *